United States Patent
Chen et al.

(10) Patent No.: US 11,920,236 B2
(45) Date of Patent: Mar. 5, 2024

(54) COATING MACHINE AND COATING METHOD

(71) Applicants: SANVAC (BEIJING) MAGNETICS CO., LTD., Beijing (CN); BEIJING ZHONG KE SAN HUAN HI-TECH CO., LTD., Beijing (CN)

(72) Inventors: Guoan Chen, Beijing (CN); Bin Fang, Beijing (CN); Haojie Wang, Beijing (CN); Yugang Zhao, Beijing (CN)

(73) Assignees: SANVAC (BEIJING) MAGNETICS CO., LTD., Beijing (CN); BEIJING ZHONG KE SAN HUAN HI-TECH CO., LTD., Beijing (CN)

( * ) Notice: Subject to any disclaimer, the term of this patent is extended or adjusted under 35 U.S.C. 154(b) by 133 days.

(21) Appl. No.: 17/357,296

(22) Filed: Jun. 24, 2021

(65) Prior Publication Data
US 2021/0317566 A1    Oct. 14, 2021

Related U.S. Application Data

(63) Continuation of application No. PCT/CN2018/125321, filed on Dec. 29, 2018.

(51) Int. Cl.
| | | |
|---|---|---|
| B32B 15/01 | (2006.01) | |
| C23C 14/02 | (2006.01) | |
| C23C 14/16 | (2006.01) | |
| C23C 14/34 | (2006.01) | |
| H01F 1/057 | (2006.01) | |
| H01F 41/02 | (2006.01) | |

(52) U.S. Cl.
CPC ............ *C23C 14/165* (2013.01); *B32B 15/01* (2013.01); *C23C 14/022* (2013.01); *C23C 14/3464* (2013.01); *H01F 1/057* (2013.01); *H01F 41/0253* (2013.01); *B32B 2307/208* (2013.01)

(58) Field of Classification Search
CPC ................ H01F 41/0293; B32B 2307/208
See application file for complete search history.

(56) References Cited

U.S. PATENT DOCUMENTS

| 2003/0017338 A1 | 1/2003 | Takai et al. |
| 2017/0062105 A1 | 3/2017 | Dong et al. |

FOREIGN PATENT DOCUMENTS

| CN | 101375352 A | 2/2009 |
| CN | 103854819 A | 6/2014 |
| CN | 106282948 A | 1/2017 |
| CN | 107808768 A | 3/2018 |
| CN | 107937879 A | 4/2018 |
| CN | 108039259 A | 5/2018 |
| CN | 108231394 A | 6/2018 |
| CN | 108315703 A | 7/2018 |
| CN | 207958490 U | 10/2018 |
| JP | S61264157 A | 11/1986 |
| JP | S62188745 A | 8/1987 |
| JP | 2005294558 A | * 10/2005 |
| JP | 2012039100 A | 2/2012 |
| WO | 2008075712 A1 | 6/2008 |

OTHER PUBLICATIONS

English Translation of JP2005294558A form EPO obtained Apr. 22, 2023 (10 pages) (Year: 2023).*
The State Intellectual Property Office of People's Republic of China the First Office Action for Application No. 2018800050045 dated Oct. 30, 2020 12 Pages (with translation).
The State Intellectual Property Office of People's Republic of China the First Search Report for Application No. 2018800050045 dated Oct. 22, 2020 2 Pages.
The Japan Patent Office (JPO) Notice of Reasons for Refusal for JP Application No. 2021-534239 dated Nov. 30, 2021 10 pages.
World Intellectual Property Organization (WIPO) International Search Report for PCT/CN2018/125321 dated Sep. 30, 2019 7 pages (including translation).

* cited by examiner

*Primary Examiner* — Adam Krupicka
(74) *Attorney, Agent, or Firm* — ANOVA LAW GROUP, PLLC

(57) ABSTRACT

A composite coating layer for coating a NdFeB rare earth magnet includes a first coating layer and a second coating layer formed over a surface of the first coating layer. The first coating layer includes a Nd coating layer, a Pr coating layer, or an alloy coating layer including two or more of Nd, Pr, and Cu. The second coating layer includes a Tb coating layer.

9 Claims, 1 Drawing Sheet

COATING MACHINE AND COATING METHOD

CROSS-REFERENCE TO RELATED APPLICATION

This application is a continuation of International Application No. PCT/CN2018/125321, filed Dec. 29, 2018, the entire content of which is incorporated herein by reference.

TECHNICAL FIELD

The present disclosure is in the field of mechanical equipment, especially relating to a coating machine and coating method for manufacturing a rare earth magnet.

BACKGROUND TECHNOLOGY

Sintered NdFeB magnets have excellent magnetic properties and are widely used in electronics, information, automotive industry, medical equipment, energy, transportation, and other fields. In recent years, there have been new applications in the fields of energy conservation and environmental protection such as wind power generation, energy-saving home appliances and new energy vehicles. Many of these applications require magnets to have good heat resistance, not only requiring magnets to have a relatively high maximum magnetic energy product (BH) max, but also requiring high intrinsic coercivity Hcj, in order to reduce the irreversible demagnetization during use, especially in a relatively high temperature environment, and to ensure that the magnet maintains high magnetic performance even if used in the above environment for a long time. One of the methods is to diffuse the heavy rare earth elements into the grain boundaries of the magnet and the edge regions of the main phase grains, which not only can achieve the purpose of increasing the anisotropic field, but also can avoid reducing the remanence and magnetic energy product, and reduce the cost at the same time.

Chinese Patent Publication No. CN106282948A discloses a coating method, a coating system, and a preparation method of a rare earth magnet. The method and system in this publication use continuous-pass magnetron sputtering equipment to sputter heavy rare earth metals such as Dy or Tb on the surface of the magnet, effectively controlling the thickness and uniformity of the sputtering layer, and realizing rapid and continuous production of magnets by grain boundary diffusion technology. However, since a single heavy rare earth metal target is selected for the target, the cost of the target is high, and the utilization rate of heavy rare earth is insufficient.

Chinese Patent Publication No. CN101375352A discloses a method for preparing a magnet. First, a metal film layer such as Al is deposited on the surface of the magnet by sputtering, and then a heavy rare earth film layer of Dy and Tb is sputtered on the Al film. The element Al diffuses from the surface to the inside of the sintered magnet, and the heavy rare earth element diffuses from the surface to the inside of the sintered magnet, so that the performance of the magnet can be improved. However, the performance of the magnets after diffusion is not improved enough, and the consistency of the magnetic properties of the mass-produced magnets is not good.

SUMMARY

In order to solve the above-mentioned problems, the present disclosure proposes a coating machine and a coating method, which improve the intrinsic coercivity and maximum energy product of the magnet through a new composite coating, improve the use efficiency of heavy rare earth metals, and the performance between multiple magnets remains stable.

The present disclosure provides a coating machine comprising a coating chamber, having a target mounted on top thereof. The target includes a first target and a second target; the first target is an Nd target, or a Pr target, or an alloy target of at least two or more of Nd, Pr, and Cu; the second target is a Tb target; the first target is located in front of the second target.

In the above coating machine, the target further includes a third target which is a Dy target, and the third target is located behind the second target.

The coating machine described above further comprises a cleaning chamber and a first buffer chamber, wherein an ion bombardment cleaner is installed in the cleaning chamber, which communicates with the coating chamber, and the first buffer chamber communicates with the coating chamber.

The above-mentioned coating machine further comprises a sample feeding chamber and a cooling chamber. The sample feeding chamber is connected to the cleaning chamber, and the cooling chamber is connected to the first buffer chamber through a first valve.

In the above coating machine, the top of each of the sample feeding chamber, the cleaning chamber, and the first buffer chamber is connected to a molecular pump; the molecular pump of the sample feeding chamber is located on the side close to the cleaning chamber; the molecular pumps are installed at two ends of the cleaning chamber; the molecular pump of the first buffer chamber is located at one end close to the coating chamber.

The above-mentioned coating machine further comprises a second buffer chamber, the sample feeding chamber is connected to the second buffer chamber through a second valve, and the second buffer chamber is connected to the cleaning chamber through a third valve.

The above-mentioned coating machine further comprises a preheater which may be located in the sample feeding chamber, or in the second buffer chamber, or in the cleaning chamber.

In the above coating machine, the first buffer chamber, the cleaning chamber, and the second buffer chamber are each connected to a molecular pump.

In the above coating machine, the molecular pump is located at the top of the first buffer chamber, the cleaning chamber, and the second buffer chamber; the molecular pump of the first buffer chamber is located at one end close to the coating chamber; molecular pumps are installed at two ends of the cleaning chamber; the molecular pump of the second buffer chamber is located at one end close to the third valve.

The above-mentioned coating machine further comprises a sample discharging chamber, and the cooling chamber is connected to the sample discharging chamber through a fourth valve.

The above-mentioned coating machine further comprises a sample inlet and a sample outlet. The sample inlet is connected to the sample feeding chamber and the sample outlet is connected to the sample discharging chamber.

In the above coating machine, the sample feeding chamber, cooling chamber and sample discharging chamber are all connected to vacuum pumps; the cleaning chamber, coating chamber, first buffer chamber, cooling chamber and sample discharge chamber are connected to an inert gas device.

The disclosure further provides a method of coating using the above-mentioned coating devices, comprising the steps of:

Coating: Feeding magnet into the coating chamber, and the magnet passes under the first target and the second target for sputtering in sequence;

After the magnet passes the first target, the first coating layer which is a Nd coating layer or a Pr coating layer, or an alloy coating layers with at least two or more of Nd, Pr, and Cu is formed on the surface of the magnet.

After the magnet passes the second target, the second coating layer which is a Tb coating layer is formed on the outer surface of the first coating layer.

In the above coating method, the sputtering power of the first target during coating is 1~6 kW and the sputtering power of the second target is 12~25 kW. The thickness of the first coating is 0.2~2 μm, and the thickness of the second coating layer is 2~10 μm.

In the above coating method, after the magnet passes under the second target, it passes under the third target. A third coating layer is formed on the surface of second coating layer, and the third coating layer is a Dy coating layer.

In the above coating method, the sputtering power of the third target during coating is 8~12 kW, and the thickness of the third coating layer is 1~2 μm.

In the above coating method, the coating step is preceded by the step of ion cleaning the magnet.

The method of coating includes following processes:

Process one with following steps:

A1. Pre-evacuate the sample feeding chamber, second buffer chamber, and cooling chamber to below $10^{-1}$ Pa, pre-evacuate the cleaning chamber, coating chamber, and first buffer chamber to below $8\times10^{-3}$ Pa, and then clean Inert gas is introduced into the cleaning chamber, the coating chamber and the first buffer chamber at a pressure of 0.5~0.7 MPa;

B1. Feed the magnet into the sample feeding chamber, and evacuate the sample feeding chamber to below $10^{-1}$ Pa;

C1. Open the second valve, feed the magnet into the second buffer chamber, then close the second valve, and evacuate the second buffer chamber to below $8\times10^{-3}$ Pa;

D1. Open the third valve, deliver the magnet into the cleaning chamber, close the third valve, and perform ion cleaning on the magnet. The pressure of the cleaning chamber is 0.5~0.7 MPa;

E1. Feed the magnet into the coating chamber and perform the coating step;

F1. Feed the magnet into the first buffer chamber; open the first valve, the magnet enters the cooling chamber, close the first valve, and introduce inert gas into the cooling chamber to a pressure of 100~110 kPa, cooling the magnet;

Or process two with following steps:

A2. Pre-evacuate the sample feeding chamber and the cooling chamber to below $10^{-1}$ Pa, pre-evacuate the cleaning chamber, coating chamber, and first buffer chamber to below $8\times10^{-3}$ Pa, and then introduce clean Inert gas into the cleaning chamber, the coating chamber and the first buffer chamber, at a pressure of 0.5~0.7 MPa;

B2. Feed the magnet into the sample feeding chamber, and evacuate the sample feeding chamber to below $8\times10^{-3}$ Pa;

C2. Open the fifth valve, feed the magnet into the cleaning chamber, close the fifth valve, and perform ion cleaning on the magnet. The pressure in the cleaning chamber is 0.5~0.7 MPa.

D2. Feed the magnet into the coating chamber and perform the coating step;

E2. Feed the magnet into the first buffer chamber; open the first valve, the magnet enters the cooling chamber, close the first valve, and introduce inert gas to the cooling chamber until the air pressure in the cooling chamber is 100~110 kPa, cooling the magnet.

In the above-mentioned coating method, after step F1 of process one or after step E2 of process two, further steps are included:

G. Open the fourth valve, feed the magnet into the sample discharging chamber, close the fourth valve, and fill the sample discharging chamber with inert gas for cooling;

H. Open the sample discharging chamber valve and deliver the magnet out of the sample discharging chamber.

In the above coating method, when steps D1 and E1 of process one are performed, the molecular pumps of the second buffer chamber, cleaning chamber, and first buffer chamber are in working condition. Or when steps C2 and D2 of process two are performed, the molecular pumps in the sample feeding chamber, cleaning chamber, and first buffer chamber are in working condition.

In the above coating method, the magnet is preheated at temperature of 100~200° C. before entering the coating chamber.

The coating machine and coating method of the present disclosure can improve the performance of the magnet after heat treatment by sputtering the composite coating layers on the magnet. With the composite coating layers, the use of heavy rare earth metals can be saved and the use efficiency of heavy rare earth metals can be improved. During production, magnets have stable performance and high consistency.

DETAILED DESCRIPTION OF THE EMBODIMENTS

Figure 1:
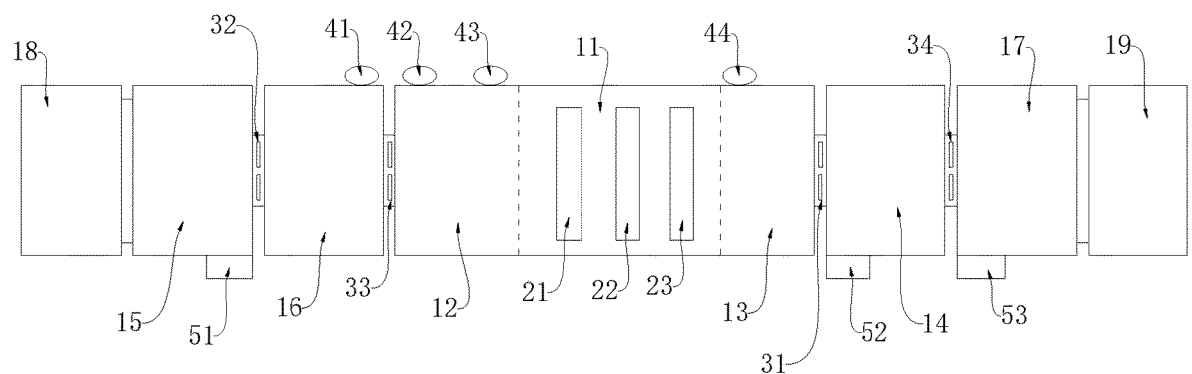
FIG. 1 is a schematic view of a coating machine according to embodiments of the disclosure.

The embodiments of the present disclosure will be described in more detail with reference to the accompanying drawings and examples in order to provide a better understanding of the aspects of the disclosure and its advantages. However, the specific embodiments and examples described below are illustrative only rather than limiting of the disclosure.

The "connection" mentioned in the present disclosure, unless otherwise clearly specified or limited, should be understood in a broad sense, and it may be directly connected or connected through an intermediary. In the description of the present disclosure, it should be understood that the directional or positional relationship indicated by "up," "down," "front," "rear," "left," "right," "top," "bottom," etc. is based on the orientation or positional relationship shown in the drawings, which is only for the convenience of describing the present disclosure and simplifying the description, rather than indicating or implying that the device or element referred to must have a specific orientation or be constructed and operated in a specific orientation, therefore It should not be understood as a limitation to the present disclosure.

In the present disclosure, relationship terms such as first and second are used to distinguish only one entity or operation from another entity or operation, without necessarily requiring or implying any such actual relationship or order between these entities or operations.

As shown in FIG. 1, an embodiment of the present disclosure provides a coating machine comprising a coating chamber 11. When the magnet passes through the coating chamber 11, the target can be sputtered onto the magnet. The coating chamber 11 is mounted on top with a target comprising a first target 21 and a second target 22, the first target 21 being a Nd target, or a Pr target, or an alloy target of at least two or more of Nd, Pr, Cu, the second target 22 being a Tb target, and the first target 21 being located in front of the second target 22. The number of the first target 21 and the second target 22 may be one or more. In this disclosure, phrases such as "in front of," "before," and "behind" used to describe the positional relationship between two parts of the coating machine, or two items placed in the coating machine, refer to the positional relationship with respect to the direction of feeding a magnet in the coating machine. For example, in the coating machine shown in FIG. 1, a magnet is fed from left to right, hence "in front of" or "before" means on the left, while "behind" means on the right.

The magnet is sputtered to form a composite coating in the coating chamber 11, followed by heat treatment to improve the performance of the magnet. In the composite coating layer of the magnet, a first coating layer is below the second coating layer. The first coating layer is an Nd coating layer, or a Pr coating layer, or an alloy coating layer of at least two or more of Nd, Pr, Cu, which saves the use of the heavy rare earth and improves the use efficiency of the heavy rare earth while guaranteeing the final magnet properties.

Optionally, the target further includes a third target 23 which is a Dy coating layer, and the third coating layer 23 is located behind the target 22. During sputtering, the magnet passes through the first target 21, the second target 22, and the third target 23 in sequence. The number of the third target 23 may be one or more. When the third target 23 is not used, the thickness of the second coating layer can be appropriately increased.

The above-mentioned coating machine further comprises a cleaning chamber 12 and the first buffer chamber 13. An ion bombardment cleaner is installed in the cleaning chamber 12, which bombards the magnet surface to remove surface impurities and oxide layers. The cleaning chamber 12 is located before the coating chamber 11 and communicates with the coating chamber 11. There may be no partition between the cleaning chamber 12 and the coating chamber 11, that is, no valve is provided.

The first buffer chamber 13 communicates with the coating chamber 11, and there is no partition between the first buffer chamber 13 and the coating chamber 11. The first buffer chamber is used to store the coated magnets, which plays a transitional role and is convenient for continuous production. In actual use, the cleaning chamber 12, the coating chamber 11 and the first buffer chamber 13 may be a closed chamber, which is divided into three different areas.

Optionally, the coating machine further comprises a sample feeding chamber 15 and a cooling chamber 14, the sample feeding chamber 15 is connected to the cleaning chamber 12, and the cooling chamber 14 is connected to the first buffer chamber 13 through the first valve 31. When the magnet is being cleaned or coated, the environment can be a vacuum environment or it may be stabilized at a certain pressure. A sample feeding chamber 15 is provided in which the magnet first enters sample feeding chamber 15 at the time of feed, and goes through a valve between the sample feeding chamber 15 and the cleaning chamber 12, ensuring that the environment in the coating chamber 11 is not disturbed by the outside.

After the magnet is coated, it enters the cooling chamber 14 for cooling in the form of air cooling. The first buffer chamber 13 can prevent the gas in the cooling chamber 14 from entering the coating chamber 11 to avoid affecting the magnets in the coating chamber. The coated magnets can stay in the first buffer chamber 13, waiting for entry into the cooling chamber 14. If the magnet needs to be coated repeatedly, the magnet passes through the coating chamber 11 and can return to the coating chamber 11 after staying in the first buffer chamber 13. The coating machine described above also comprises the second buffer chamber 16, the sample feeding chamber 15 is connected to the second buffer chamber 16 through a second valve 32, and the second buffer chamber 16 is connected to the cleaning chamber 12 through a third valve 33. The second buffer chamber 16 is arranged between the sample feeding chamber 15 and the cleaning chamber 12, playing a transitional role during automated mass production.

The above-mentioned coating machine further comprises a preheater (not shown in the figure). The preheater may be located in the sample feeding chamber 15 or in the second buffer chamber 16 or in the cleaning chamber 12. The installation position of the preheater is selected according to actual needs. The preheater can raise the temperature of the magnet to 100 to 200° C., within which temperature range the metal target atoms sputtered during the plating process can both increase the binding force to the magnet and avoid waste of resources and increase of cost.

Optionally, the first buffer chamber 13, the cleaning chamber 12 and the second buffer chamber 16 are each connected to a molecular pump. Usually molecular pumps are used together with rotating Roots pumps to improve the efficiency of vacuuming.

In some embodiments, a molecular pump is located at the top of each of the first buffer chamber 13, the cleaning chamber 12, and the second buffer chamber 16. The molecular pump 44 of the first buffer chamber 13 is located at one end close to the chamber 11. A molecular pump 42 and a molecular pump 43 are installed at two ends of the cleaning chamber 12. The molecular pump 41 of the second buffer chamber 16 is located at one end close to the third valve 33.

Magnets used for sputtering are usually machined into a sheet shape. The surface contains pores, which are easy to absorb impurity gases. After the magnet absorbs impurity gases and goes through sputtering, the surface of the magnet will turn yellow, which will affect the quality of the magnet. In the embodiments of the present disclosure, the molecular pumps are arranged on the tops of the first buffer chamber 13, the cleaning chamber 12 and the second buffer chamber 16. The second buffer chamber 16 and the cleaning chamber 12 are each provided with a molecular pump adjacent to the third valve, and when the third valve 33 is opened, the direction of flow of the evacuated gas is upward, creating a "gas curtain" effect in the intermediate region of the molecular pump 41 and the molecular pump 42, ensuring that the impurity gas of the second buffer chamber 16 does not enter the cleaning chamber 12. During operation, the molecular pumps 42 and 43 in the cleaning chamber will also form a "air curtain" effect to further ensure that impurity gases in the cleaning chamber do not enter the coating chamber area. The molecular pump 44 in the first buffer chamber also serves to block impurity gases.

The above-mentioned coating machine further comprises a sample discharging chamber 17, and the cooling chamber 14 is connected to the sample discharging chamber 17 through a fourth valve 34. The magnet can be further cooled in the sample discharging chamber 17 to avoid the excessive residence time of the magnets in the cooling chamber 14, resulting in longer production cycles.

The coating machine of this embodiment also further includes a transfer system (not shown) including a plurality of side-by-side rollers on which trays are provided. The rotation of the rollers is capable of moving the trays. The roller is driven by the motor to rotate, and the magnet is placed on the tray, and the tray is driven to pass through the various chambers in turn.

Optionally, the above coating machine further comprises a sample inlet 18 and a sample outlet 19, the sample inlet 18 being connected to the sample feeding chamber 15, and the sample outlet 19 being connected to the sample discharging chamber 17. The sample inlet 18 is used to place a tray to facilitate the placement of the magnets. A valve is provided at one end of the sample feeding chamber 15 near the sample inlet 18 to control the entry of magnets to the sample feeding chamber 15. When the magnet is delivered out from the sample discharging chamber 17, the sample outlet 19 is used to support the tray.

In the above-mentioned coating machine, the sample feeding chamber 15, the cooling chamber 14 and the sample discharging chamber 17 are all connected to vacuum pumps. In this embodiment, the vacuum pump is a rotary Roots mechanical pump unit. The vacuum pump 51 of the sample feeding chamber, the vacuum pump 52 of the cooling chamber, and the vacuum pump 53 of the sample discharging chamber are respectively used for vacuuming the corresponding chambers.

The cleaning chamber 12, the coating chamber 11, the first buffer chamber 13, the cooling chamber 14 and the sample discharging chamber 17 are connected to an inert gas device. The inert gas device can fill the cleaning chamber 12, the coating chamber 11, the first buffer chamber 13, the cooling chamber 14 and the sample discharging chamber 17 with inert gas, which in this embodiment is argon. When sputtering the magnet, the cathode of the target material can be water-cooled by a cooling device. The power control device can control the power of the target.

Figure 2:
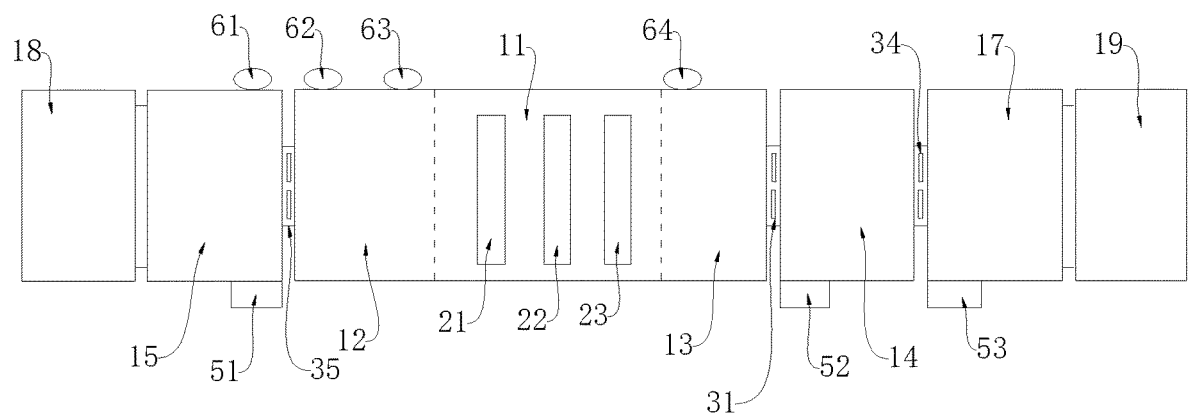
FIG. 2 is a schematic view of another coating machine according to embodiments of the present disclosure.

As shown in FIG. 2, in another embodiment, according to the change of the production cycle, the coating machine may not comprise the second buffer chamber, and the sample feeding chamber 15 is connected to the cleaning chamber 12 through the fifth valve 35. Molecular pumps are connected to the tops of the sample feeding chamber 15, the cleaning chamber 12 and the first buffer chamber 13, respectively. The molecular pump 61 of the sample feeding chamber is located on the side close to the cleaning chamber; the molecular pump 62 and the molecular pump 63 are installed at two ends of the cleaning chamber. The molecular pump 64 of the first buffer chamber is located at one end close to the coating chamber. Usually molecular pumps are used together with rotary Roots pumps to improve the efficiency of vacuuming. Other parts of the coating machine shown in FIG. 2 are the same as corresponding other parts of the coating machine shown in FIG. 1.

The embodiments of this disclosure further provide a method of coating using the above-mentioned coating devices, comprising the steps of:

Coating: feeding magnet into the coating chamber, the magnet passing under the first target and the second target for sputtering; in some embodiments, the speed of the magnet passing through the coating chamber is 1~20 mm/s.

After the magnet passes the first target, the first coating layer which is a Nd coating layer or a Pr coating layer, or an alloy coating layers with at least two or more of Nd, Pr, and Cu is formed on the surface of the magnet. The sputtering power of the first target during coating is 1~6 kW, and the thickness of the first coating layer is 0.2~2 μm.

After the magnet passes the second target, the second coating layer which is a Tb coating layer is formed on the outer surface of the first coating layer. The power of sputtering of the second target is 12~25 kW, and the thickness of the second coating layer is 2~10 μm.

Optionally, in the above-mentioned coating method, after the magnet passes under the second target, it passes under the third target to form a third coating layer which is a Dy coating layer on the surface of the second coating layer. The power of sputtering the Tb target is 8~12 kW, and the thickness of the third coating layer is 2 μm.

This embodiment controls the power of the targe, which may result in low efficiency of sputtering if the power of the target is too low, and may result in breakdown of the cathode target if the power of the target is too high.

In the above coating method, the coating step is preceded by the step of ion cleaning the magnet. In some embodiments, the speed of the magnet passing through the cleaning chamber is 20~60 mm/s.

More specifically, the above coating method includes:

Process one with following steps:

1. Pre-evacuate the sample feeding chamber, second buffer chamber, and cooling chamber to below $10^{-1}$ Pa, and pre-evacuate the cleaning chamber, coating chamber, and first buffer chamber to below $8 \times 10^{-3}$ Pa to remove impurity gas from the coating chamber. Then, inert gas, such as argon, is introduced into the cleaning chamber, the coating chamber, and the first buffer chamber at pressure of 0.5~0.7 MPa.

2. Feed the magnet into the sample feeding chamber, and evacuate the sample feeding chamber to below $10^{-1}$ Pa.

3. Open the second valve, and after feeding the magnet into the second buffer chamber, close the second valve and evacuate the second buffer chamber to below $8 \times 10^{-3}$ Pa.

4. Open the third valve, feed the magnet into the cleaning chamber, close the third valve, and perform ion cleaning on the magnet. The pressure in the cleaning chamber is 0.5~0.7 MPa.

5. Feed the magnet into the coating chamber and perform the coating step.

6. Feed the magnet into the first buffer chamber; open the first valve, the magnet enters the cooling chamber, close the first valve, and introduce inert gas, such as argon, into the cooling chamber to a pressure of 100~110 kPa in the cooling chamber.

7. Open the fourth valve, feed the magnet into the sample discharging chamber, close the fourth valve, and fill the sample discharging chamber with inert gas, such as argon, to continue cooling the magnet.

8. Open the sample discharging chamber valve and deliver the magnet out of the sample feeding chamber.

In the above coating method, when steps 4 and 5 are performed, the molecular pumps of the second buffer chamber, the cleaning chamber, and the first buffer chamber are in operation. The molecular pump has been operated to avoid entry of impurity gases into the coating chamber and to maintain stability of the coating chamber atmosphere to avoid effects on sputtering.

In the above coating method, the magnet is preheated at temperature of 100~200° C. before entering the coating chamber. The magnet can be preheated in the sample feeding chamber, in the second buffer chamber, or in the cleaning chamber.

Or process two, using a coating machine that does not comprise a second buffer chamber for coating, including the steps:

1. Pre-evacuate the sample feeding chamber and cooling chamber to below $10^{-1}$ Pa, and pre-evacuate the cleaning chamber, coating chamber, and first buffer chamber to below $8 \times 10^{-3}$ Pa to remove impurity gases in the coating chamber. Then, inert gas, such as argon, is introduced into the cleaning chamber, the coating chamber, and the first buffer chamber at pressure of 0.5~0.7 MPa.

2. Feed the magnet into the sample feeding chamber, and evacuate the sample feeding chamber to below $8 \times 10^{-3}$ Pa.

3. Open the fifth valve to feed the magnet into the cleaning chamber, and close the fifth valve to perform ion cleaning on the magnet. The pressure in the cleaning chamber is 0.5~0.7 MPa.

4. Feed the magnet into the coating chamber and perform the coating step.

5. Feed the magnet into the first buffer chamber; open the first valve, the magnet enters the cooling chamber, close the first valve, and introduce inert gas, such as argon, into the cooling chamber to a pressure of 100~110 kPa in the cooling chamber.

6. Open the fourth valve, feed the magnet into the sample discharging chamber, close the fourth valve, and fill the sample discharging chamber with inert gas, such as argon, to continue cooling the magnet.

7. Open the sample discharging chamber valve and deliver the magnet out of the sample discharging chamber.

In this coating method, when steps 3 and 4 are performed, the molecular pumps of the sample feeding chamber, the cleaning chamber, and the first buffer chamber are in operation. The molecular pump has been operated to avoid entry of impurity gases into the coating chamber and to maintain stability of the coating chamber atmosphere to avoid effects on sputtering.

Process two for coating using a coating machine which does not contain a second buffer chamber and Process One for coating a coating machine which comprises a second buffer chamber are identical in the coating process and in the post-coating magnet state, except that the production cycle is different and the production cycle with the second buffer chamber is shortened, but the cost of the coating machine without the second buffer chamber is reduced. The coating process or post-coating magnets based on Process one and Process two are identical and only embodiments related to Process one are listed herein.

After one batch of magnets are coated, the next batch of magnets are coated in the coating chamber to achieve continuous automatic production. The coated magnet undergoes heat treatment to obtain the final magnet.

Example 1

Process A: Preparation of Magnet

Step 1. Prepare the main alloy raw material and the auxiliary alloy raw material according to the mass ratio of each element. The mass ratio of each element of the main alloy raw material is $(PrNd)_{31}Al_{0.2}Co_{1.0}Cu_{0.1}Ga_{0.6}B_{0.97}Sn_{0.1}Fe_{bal}$. The mass ratio of each element of the auxiliary alloy raw material is $(PrNd)_{32.5}Al_{0.15}Co_{1.0}Cu_{0.1}Ga_{0.6}B_{0.94}Fe_{bal}$. $Fe_{bal}$ is the equilibrium ratio of Fe elements, i.e., the sum of the mass ratios of all elements is 100%.

Step 2. The main alloy raw materials and the auxiliary alloy raw materials are melted in a 600 Kg/time strip casting furnace (strip casting), and the scale is cast at a roller speed of 1.5 m/s, and the main alloy flakes and auxiliary alloy flakes with average thickness of 0.15 mm are finally obtained.

Step 3. The main alloy flakes and the auxiliary alloy flakes are subjected to hydrogen crushing, specifically, dehydrogenation is performed at 540° C. for 6 hours after saturated hydrogen absorption, and the hydrogen content is 1200 ppm, to obtain medium-crushed powder of the main alloy and the auxiliary alloy. The medium-crushed powders of the main alloy and the auxiliary alloy are put into the jet mill to obtain the main alloy powder and the auxiliary alloy powder with D50=3.6 μm. D50 refers to the medium diameter of the powder Step 4. Mix the main alloy powder and the auxiliary alloy powder according to the mass ratio of 98:2 to obtain mixed alloy powder.

Step 5. The mixed alloy powder is oriented and compressed under the magnetic field of an automatic press to form a compact. The orientation magnetic field is 1.8 T and the initial compaction density of the compact is 4.2 g/cm$^3$.

Step 6. Put the compact into a vacuum sintering furnace for sintering to obtain a sintered magnet. The sintering temperature is 1000° C. and the time is 6 h. After sintering, the magnet density is 7.52 g/cm$^3$.

Step 7. The tempering treatment includes primary tempering with heat preservation at 920° C. for 2 h and secondary tempering with heat preservation at 490° C. for 4 h.

Step 8. Perform slicing of the magnet after tempering to produce a magnet having a size of 64×25×2 mm (2 mm direction is magnet orientation direction). The surface of the magnet is degreased and pickled.

Ten samples of the same batch of post-tempering magnets of this Example are randomly selected for performance testing. The test results are as follows:

| Br (kGs) | Hcj (kOe) | Hk/Hcj | (BH)max (MGOe) |
|---|---|---|---|
| 13.84~13.88 | 17.23~17.82 | 0.97~0.98 | 46.50~47.04 |

The magnetic properties of 30 batches of magnets are tested and the results are analyzed as follows:

Set the quality conditions as Br being 13.8±0.1, Hcj being 17.5±1 kOe, and the calculated results are (CPK of Br)=1.68 and (CPK of Hcj)=1.87.

Process B: Sputtering Process on the Magnet Surface

Step 1. Place the tray on the sample inlet, and place the processed magnets of process A tightly on the stainless steel tray with the dimension of 2 mm pointing upwards, and the size of the tray is 1300×1000 mm. There is a need to clean the surface of the magnet using compressed air.

Step 2. Pre-evacuate the sample feeding chamber, the second buffer chamber, and the cooling chamber to $10^{-1}$ Pa, and pre-evacuate the cleaning chamber, coating chamber, and the first buffer chamber to $8 \times 10^{-3}$ Pa, after which argon gas was introduced into the cleaning chamber, coating chamber, and the first buffer chamber and the steady pressure of first buffer chamber is 0.5 MPa.

Step 3. Feed the aligned magnets into the feed chamber using a tray and evacuate the sample feeding chamber to $10^{-1}$ Pa.

Step 4. Open the second valve and feed the magnet entering the sample feeding chamber into the second buffer chamber. Close the second valve and evacuate the second buffer chamber to below 8×10⁻³ Pa. Activate the preheater in the second buffer chamber, and the surface temperature of the heated magnet is 150° C.

Step 5. Open the third valve and feed the magnet in the second buffer chamber into the cleaning chamber. Close the third valve, and perform ion cleaning on the magnet, and the pressure in the cleaning chamber is 0.5 MPa. The magnet quickly passes under the ion bombardment cleaner at a speed of 40 mm/s, and the cleaning power of the ion bombardment cleaner is 2 kw.

Step 6. Feed the magnet in the cleaning chamber into the coating chamber and pass under the target at a speed of 10 mm/s. The distance between the lower surface of the target and the upper surface of the magnet is 100 mm. The magnet first passes through the first target having sputtering power of 3 kW. The first coating layer-Nd coating layer is formed on the surface of magnet. After that, the magnet passes through the second target having sputtering power of 17 kw. The second coating layer-Tb coating layer is formed on the surface of the first coating layer. After that, the magnet passes through the third target having sputtering power of 8 kW. The third coating layer-Dy coating layer is formed on the surface of the second coating layer. The pressure of the coating chamber is 0.5 MPa.

Step 7. The coated magnets on the tray are fed to the first buffer chamber. After all the magnets on the single batch of trays enter the first buffer chamber, open the first valve and let the magnets enter the cooling chamber at a speed of 40 mm/s. Close the first valve, introduce argon gas into the cooling chamber until the air pressure in the cooling chamber is 100 kPa, and cool the magnet for 15 minutes.

Step 8. Open the fourth valve, feed the magnet into the sample discharging chamber, close the fourth valve, and fill the sample discharging chamber with argon to continue its secondary cooling.

Step 9. Deliver the secondary-cooled magnet in the sample discharging chamber to the sample outlet, turn the magnet over, and repeat steps 3-9. After the coating was completed, the thickness of the film layer was measured using an X-ray fluorometer, the thickness of the first coating layer was 0.8~0.9 μm, the thickness of the second coating layer was 5.0~5.3 μm, and the thickness of the third coating layer was 1.4~1.5 μm.

In the above cleaning and coating steps, each molecular pump is in operation.

Process C: The Sputtered Magnet Undergoes Thermal Diffusion Treatment Process.

The coated magnet of process B is heat-treated in a vacuum environment. The primary heat treatment process: heat preservation at 920° C. for 8 hours; the second heat treatment process: heat preservation at 480° C. for 6 hours.

32 pieces of rare earth diffusion magnets are randomly sampled from the magnets for magnetic performance test. The performance test results are as follows:

| Br (kGs) | Hcj (kOe) | Hk/Hcj | (BH)max (MGOe) |
|---|---|---|---|
| 13.71~13.82 | 27.53~28.39 | 0.97~0.98 | 46.68~47.15 |

The magnetic properties of 30 batches of rare earth diffusion magnets in this Example are tested and analyzed.

Set quality conditions as Br being 13.8±0.1, Hcj being 28.0±1 kOe. The calculated results are (CPK of Br)=1.67 and (CPK of Hcj)=1.77. CPK is the engineering capacity index of the process.

Comparative Example 1

The steps of this Comparative Example are basically the same as those of Example 1, except that in step 6 of process B, the first target and the third target are turned off, only the Tb coating is sputtered on the surface of the magnet, the power of the sputtering Tb target is 20 kW and the thickness of the Tb coating is 8.1~8.3 μm.

32 pieces of rare earth diffusion magnets which go through Process C in this Example are randomly sampled for magnetic performance test. The performance test results are as follows:

| Br (kGs) | Hcj (kOe) | Hk/Hcj | (BH)max (MGOe) |
|---|---|---|---|
| 13.66~13.71 | 27.73~28.52 | 0.97~0.98 | 46.32~47.01 |

The magnetic properties of 30 batches of rare earth diffusion magnets which go through Process C are tested and analyzed.

Set quality conditions as Br being 13.7±0.1, Hcj being 28.0±1 kOe. The calculated results are (CPK of Br)=1.35 and (CPK of Hcj)=1.50.

Comparative Example 2

This Example is basically the same as Example 1, except that in step 6 of Process B, when the magnet is sputtered, the first target is changed from Nd target to Al target with a sputtering power of 4 kW to form a first coated Al coating layer on the magnet with a thickness of 0.8~0.9 μm.

32 pieces of rare earth diffusion magnets are randomly sampled from the magnets in this Comparative Example for magnetic performance test. The performance test results are as follows:

| Br (kGs) | Hcj (kOe) | Hk/Hcj | (BH)max (MGOe) |
|---|---|---|---|
| 13.65~13.74 | 26.35~26.96 | 0.94~0.95 | 45.18~46.02 |

The magnetic properties of 30 batches of rare earth diffusion magnets are tested and analyzed.

Set quality conditions as Br being 13.7±0.1, Hcj being 26.0±1 kOe. The calculated results are (CPK of Br)=1.50 and (CPK of Hcj)=1.65.

Comparing with the tempered magnet of Example 1 Process A, the diffusion-treated magnets of Example 1, Comparative Example 1, and Comparative Example 2 show significant increase in the intrinsic coercivity (Hcj) and the maximum magnetic energy product (BH) max, with less reduction in remanence (Br). Comparing with Comparative Example 1, Example 1 has smaller thickness of the Tb-rich layer on the surface of the magnet of after the sputtering process B, which can save the use of heavy rare earth metals in the target. At the same time, after undergoing diffusion, the large scale magnets of Example 1 have higher actual average value of the residual magnetism than that of Comparative Example 1. While their intrinsic coercivity are basically the same, the increase of the residual magnetism of the magnet is beneficial to increase the magnetic energy product of the magnet. Comparing with Example 2, the actual average values of remanence and intrinsic coercivity of the magnets prepared in Example 1 after mass diffusion are slightly higher. At the same time, comparing with Comparative Example 1 and Comparative Example 2, the CPK values of Br and Hcj in Example 1 are both the best, indicating that the consistency of the magnetic properties during the mass production of the magnet is the best.

Comparative Example 3

The steps of the Comparative Example 3 are basically the same as those of Example 1, except that the molecular pumps 41, 42 and 43 are kept closed from the beginning of the magnet entering the sample feeding chamber until the magnet is sputtered during the coating chamber. The comparison between the obtained magnet of Comparative Example 3 and Example 1 is shown in the following table.

|  | Surface Film Layer Color | Surface Film Layer Oxygen Content (wt %) |
|---|---|---|
| Magnet obtained after Process B of Example 1 | Silver (color of terbium) | 0.1~0.3 |
| Magnet obtained after Process B of Comparative Example 3 | Golden | 0.8~2.2 |

Through the energy spectrum detection of the surface film layer of the magnet obtained after process B with scanning electron microscopy, it is found that the oxygen content of the surface film layer of Comparative Example 3 is higher than the surface film layer of Example 1. Therefore, it can be seen that in Comparative Example 3, due to the lack of the isolation effect of the molecular pump, the surface film layer is partially oxidized.

Take 40 pieces of the diffusion magnets prepared after process C in Example 1 and the diffusion magnet prepared after process C in Comparative Example 3, respectively, for high-temperature demagnetization experiments. The test conditions are 150° C. for 2 h. Measure the magnetic flux value φ1 of the magnet before high temperature treatment at 150° C. and the magnetic flux value φ2 after high temperature treatment at 150° C. and calculate the demagnetization rate=(φ1−φ2)/φ1*100. The high temperature demagnetization rate of the magnet of Example 1 is 0.5% to 2.6%, and that of Comparative Example 3 is 9.5% to 15.2%. The high-temperature demagnetization performance of the magnet of Example 1 is significantly higher than that of Comparative Example 3, indicating that opening the cleaning chamber and the second buffer chamber molecular pump in step 6 of process B have a significant effect on reducing the oxidation of the magnet coating layer.

Example 2

Process A: Magnet Preparation Process:

The magnet preparation process is the same as in Example 1, except that the magnet does not undergo the tempering heat treatment of step 7 before the slicing process.

Process B: Sputtering Process of the Surface Coating of the Magnet

Step 1. Place the tray on the sample inlet, and place the magnets processed in process A tightly on the stainless steel tray, with the magnet dimension of 2 mm pointing upwards. The tray size is 1300×1000 mm. There is a need to clean the surface of the magnet using compressed air.

Step 2. Pre-evacuate the sample feeding chamber, second buffer chamber, and cooling chamber to $10^{-1}$ Pa, pre-evacuate the cleaning chamber, coating chamber, and first buffer chamber to $7\times10^{-3}$ Pa, and introduce argon to the cleaning chamber, coating chamber and the first buffer chamber at a steady pressure of 0.6 MPa.

Step 3. Feed the aligned magnets into the sample feeding chamber using a tray and evacuate the sample feeding chamber to $10^{-1}$ Pa.

Step 4. Open the second valve and deliver the magnet in the sample feeding chamber into the second buffer chamber. Close the second valve and evacuate the second buffer chamber to below $7\times10^{-3}$ Pa. Activate the preheater, and the surface temperature of the heating magnet is 170° C.

Step 5. Open the third valve, deliver the magnet in the second buffer chamber into the cleaning chamber, close the third valve, and perform ion cleaning on the magnet. The pressure in the cleaning chamber is 0.6 MPa. The magnet quickly passes under the ion bombardment cleaner at a speed of 60 mm/s, and the cleaning power of the ion bombardment cleaner is 3 kw.

Step 6. Deliver the magnet in the cleaning chamber into the coating chamber and pass under the target at a speed of 10 mm/s. The distance between the lower surface of the target and the upper surface of the magnet is 90 mm. The magnet passes through the first target having the sputtering power of 2 kW. The first coating layer-Pr coating layer is formed on the magnet. After that, the magnet passes through the second target having sputtering power of 12 kw. The second coating layer-Tb coating layer is formed on the surface of the first coating layer. After that, the magnet passes through the third target having the sputtering power of 12 kW. The third coating layer-Dy coating layer is formed on the surface of the second coating layer. The pressure of the coating chamber is 0.6 MPa.

Step 7. Deliver the coated magnets in the coating chamber into the first buffer chamber. After all the magnets on the single batch of trays enter the first buffer chamber, open the first valve and deliver the magnets to the cooling chamber at a speed of 50 mm/s, close the first valve, introduce argon into the cooling chamber to air pressure of 105 kPa, and cool the magnet for 15 minutes.

Step 8. Open the fourth valve, feed the magnet into the sample discharging chamber, close the fourth valve, and fill the sample discharging chamber with argon to continue its secondary cooling.

Step 9. Deliver the secondary-cooled magnet in the sample discharging chamber to the sample outlet, turn the magnet over, and repeat steps 3~9. The coating layer was examined, the thickness of the first coating layer is 0.4~0.6 μm, the thickness of the second coating layer is 2.2~2.4 μm, and the thickness of the third coating layer is 1.7~1.8 μm.

During cleaning and coating, each molecular pump is in working condition.

Process C: The Sputtered Magnet Undergoes Thermal Diffusion Treatment Process.

The coated magnet is heat treated in a vacuum environment. Primary treatment: heat preservation at 920° C. for 10 h, and second treatment: heat preservation at 480° C. for 8 h.

32 pieces of diffusion magnets which go through Process C in this Example are randomly sampled for magnetic performance test. The performance test results are as follows:

| Br (kGs) | Hcj (kOe) | Hk/Hcj | (BH)max (MGOe) |
|---|---|---|---|
| 13.75~13.84 | 27.11~27.86 | 0.95~0.97 | 46.25~47.32 |

The magnetic properties of 30 batches of diffusion magnets are tested and analyzed.

Set quality conditions as Br being 13.8±0.1, Hcj being 27.5±1 kOe. The calculated results are (CPK of Br)=1.57 and (CPK of Hcj)=1.77.

Example 3

Process A: Magnet Preparation Process:

The magnet preparation process is the same as in Example 1, except that the magnet does not undergo the tempering heat treatment of step 7 before the slicing process.

Process B: Sputtering Process of the Surface Coating of the Magnet

Step 1. Place the tray on the sample inlet, and place the magnets processed in process A tightly on the stainless steel tray, with the magnet dimension of 2 mm pointing upwards. The tray size is 1300×1000 mm. There is a need to clean the surface of the magnet using compressed air.

Step 2. Pre-evacuate the sample feeding chamber, second buffer chamber, and cooling chamber to $10^{-1}$ Pa, pre-evacuate the cleaning chamber, coating chamber, and first buffer chamber to $7 \times 10^{-3}$ Pa, and introduce Argon to the cleaning chamber, coating chamber and the first buffer chamber at a steady pressure of 0.7 MPa.

Step 3. Feed the aligned magnets into the sample feed chamber using a tray and evacuate the sample feeding chamber to $10^{-1}$ Pa.

Step 4. Open the second valve and deliver the magnet in the sample feeding chamber into the second buffer chamber. Close the second valve and evacuate the second buffer chamber to below $7 \times 10^{-3}$ Pa.

Step 5. Open the third valve, deliver the magnet in the second buffer chamber into the cleaning chamber, close the third valve, and perform ion cleaning on the magnet. The pressure in the cleaning chamber is 0.7 MPa. The magnet quickly passes under the ion bombardment cleaner at a speed of 60 mm/s, and the cleaning power of the ion bombardment cleaner is 2 kw.

Step 6. Deliver the magnet in the cleaning chamber into the coating chamber and pass under the target at a speed of 20 mm/s. The distance between the lower surface of the target and the upper surface of the magnet is 95 mm. The magnet passes through the first target having the sputtering power of 5 kW. The first coating layer which is formed on the magnet is alloy plating of Nd and Pr. The mass ratio of Nd to Pr 75:25. After that, the magnet passes through the second target having sputtering power of 25 kw. The second coating layer-Tb coating layer is formed on the surface of the first coating layer. The pressure of the coating chamber is 0.5 MPa.

Step 7. Deliver the coated magnets in the coating chamber into the first buffer chamber. After all the magnets on the single batch of trays enter the first buffer chamber, open the first valve and deliver the magnets to the cooling chamber at a speed of 30 mm/s, close the first valve, introduce argon into the cooling chamber to air pressure of 110 kPa, and cool the magnet for 15 minutes.

Step 8. Open the fourth valve, feed the magnet into the sample discharging chamber, close the fourth valve, and fill the sample discharging chamber with argon to continue its secondary cooling.

Step 9. Deliver the secondary-cooled magnet in the sample discharging chamber to the sample outlet, turn the magnet over, and repeat steps 3~9. The coating layer is examined, the thickness of the first coating layer is 1.2~1.3 μm, and the thickness of the second coating layer is 9.5~9.9 μm.

During cleaning and coating, each molecular pump is in operation.

Process C: The Sputtered Magnet Undergoes Thermal Diffusion Treatment Process.

The coated magnet is heat treated in a vacuum environment. Primary treatment: heat preservation at 920° C. for 10 h, and second treatment: heat preservation at 480° C. for 8 h.

32 pieces of rare earth diffusion magnets which go through Process C in this Example are randomly sampled for magnetic performance test. The performance test results are as follows:

| Br (kGs) | Hcj (kOe) | Hk/Hcj | (BH)max (MGOe) |
|---|---|---|---|
| 13.75~13.86 | 27.12~28.02 | 0.95~0.97 | 46.25~47.30 |

The magnetic properties of 30 batches of diffusion magnets are tested and analyzed.

Set quality conditions as Br being 13.8±0.1, Hcj being 27.5±1 kOe. The calculated results are (CPK of Br)=1.56 and (CPK of Hcj)=1.77.

Example 4

Process A: Magnet Preparation Process:

The magnet preparation process is the same as in Example 1, except that the magnet does not undergo the tempering heat treatment of step 7 before the slicing process.

Process B: Sputtering Process of the Surface Coating of the Magnet

Step 1. Place the tray on the sample inlet, and place the magnets processed in process A tightly on the stainless steel tray, with the magnet dimension of 2 mm pointing upwards. The tray size is 1300×1000 mm. There is a need to clean the surface of the magnet using compressed air.

Step 2. Pre-evacuate the sample feeding chamber, second buffer chamber, and cooling chamber to $10^{-1}$ Pa, pre-evacuate the cleaning chamber, coating chamber, and first buffer chamber to $7 \times 10^{-3}$ Pa, and introduce Argon to the cleaning chamber, coating chamber and the first buffer chamber at a steady pressure of 0.7 MPa.

Step 3. Feed the aligned magnets into the sample feeding chamber using a tray and evacuate the sample feeding chamber to $10^{-1}$ Pa.

Step 4. Open the second valve and deliver the magnet in the sample feeding chamber into the second buffer chamber. Close the second valve and evacuate the second buffer chamber to below $7 \times 10^{-3}$ Pa.

Step 5. Open the third valve, deliver the magnet in the second buffer chamber into the cleaning chamber, close the third valve, and perform ion cleaning on the magnet. The pressure in the cleaning chamber is 0.7 MPa. The magnet quickly passes under the ion bombardment cleaner at a speed of 60 mm/s, and the cleaning power of the ion bombardment cleaner is 2 kw.

Step 6. Deliver the magnet in the cleaning chamber into the coating chamber and pass under the target at a speed of 5 mm/s. The distance between the lower surface of the target and the upper surface of the magnet is 95 mm. The magnet passes through the first target having the sputtering power of 6 kW. The first coating layer which is formed on the magnet is alloy plating of Nd and Pr. The mass ratio of Nd to Pr 80:20. After that, the magnet passes through the second target having sputtering power of 20 kw. The second coating layer-Tb coating layer is formed on the surface of the first coating layer. The pressure of the coating chamber is 0.5 MPa.

Step 7. Deliver the coated magnets in the coating chamber into the first buffer chamber. After all the magnets on the single batch of trays enter the first buffer chamber, open the first valve and deliver the magnets to the cooling chamber at a speed of 40 mm/s, close the first valve, introduce argon into the cooling chamber to air pressure of 101 kPa, and cool the magnet for 15 minutes.

Step 8. Open the fourth valve, feed the magnet into the sample discharging chamber, close the fourth valve, and fill the sample discharging chamber with argon to continue its secondary cooling.

Step 9. Deliver the secondary-cooled magnet in the sample discharging chamber to the sample outlet, turn the magnet over, and repeat steps 3~9. The coating layer is examined, the thickness of the first coating layer is 1.6~1.7 μm, and the thickness of the second coating layer is 7.4~7.7 μm.

During cleaning and coating, each molecular pump is in operation.

Process C: The Sputtered Magnet Undergoes Thermal Diffusion Treatment Process.

The coated magnet is heat treated in a vacuum environment. Primary treatment: heat preservation at 920° C. for 10 h, and second treatment: heat preservation at 480° C. for 8 h.

32 pieces of rare earth diffusion magnets which go through Process C in this Example are randomly sampled for magnetic performance test. The performance test results are as follows:

| Br (kGs) | Hcj (kOe) | Hk/Hcj | (BH)max (MGOe) |
| --- | --- | --- | --- |
| 13.74~13.86 | 27.01~27.92 | 0.95~0.97 | 46.15~47.27 |

The magnetic properties of 30 batches of diffusion magnets are tested and analyzed.

Set quality conditions as Br being 13.8±0.1, Hcj being 27.5±1 kOe. The calculated results are (CPK of Br)=1.56 and (CPK of Hcj)=1.75.

After the magnets in Examples 2, 3, and 4 are subjected to diffusion treatment, the intrinsic coercivity and the maximum magnetic energy product are greatly improved, and the consistency of mass production was high.

It should be noted that the various Examples described above with reference to the accompanying drawings are only used to illustrate the present disclosure and not to limit the scope of the present disclosure. Those of ordinary skill in the art should understand that without departing from the spirit and scope of the present disclosure, modifications or equivalent replacements made to the present disclosure should all fall within the scope of the present disclosure. In addition, unless the context indicates otherwise, words appearing in the singular include the plural and vice versa. In addition, unless otherwise specified, all or part of any examples can be used in combination with all or part of any other example.

The invention claimed is:

1. A composite coating layer for coating a NdFeB rare earth magnet comprising:
   a first coating layer including a NdCu coating layer, a PrCu coating layer, or a PrNdCu coating layer; and
   a second coating layer formed over a surface of the first coating layer and including a Tb coating layer.

2. The composite coating layer according to claim 1, further comprising:
   a third coating layer formed over a surface of the second coating layer and including a Dy coating layer.

3. The composite coating layer according to claim 1, wherein:
   a thickness of the first coating layer is 0.2~2 μm; and
   a thickness of the second coating layer is 2~10 μm.

4. A composite coating layer for coating a NdFeB rare earth magnet comprising:
   a first coating layer including a Nd coating layer, a Pr coating layer, or an alloy coating layer including two or more of Nd, Pr, and Cu;
   a second coating layer formed over a surface of the first coating layer and including a Tb coating layer; and
   a third coating layer formed over a surface of the second coating layer and including a Dy coating layer.

5. A coating method for preparing the composite coating layer according to claim 1, comprising:
   feeding a magnet into a coating chamber of a coating machine;
   passing the magnet under a first target in the coating chamber for sputtering to form the first coating layer over a surface of the magnet, the first coating layer including the NdCu coating layer, the PrCu coating layer, or the PrNdCu coating layer; and
   passing the magnet under a second target in the coating chamber for sputtering to form the second coating layer over an outer surface of the first coating layer, the second coating layer including the Tb coating layer.

6. The method according to claim 5, further comprising:
   before feeding the magnet into the coating chamber:
      pre-evacuating a cleaning chamber of the coating machine, the coating chamber, and a first buffer chamber of the coating machine below $8 \times 10^{-3}$Pa, pre-evacuating a sample feeding chamber of the coating machine, a second buffer chamber of the coating machine, and a cooling chamber of the coating machine below $10^{-1}$Pa, and introducing clean inert gas into the cleaning chamber, the coating chamber, and the first buffer chamber to a pressure of 0.5~0.7MPa, wherein:
      the cleaning chamber and the first buffer chamber communicates with the coating chamber;
      the cooling chamber is connected to the first buffer chamber through a first valve; and
      the second buffer chamber is connected to the sample feeding chamber through a second valve and connected to the cleaning chamber through a third valve;
   feeding the magnet into the sample feeding chamber, and evacuating the sample feeding chamber below $10^{-1}$Pa;
   opening the second valve, feeding the magnet into the second buffer chamber, closing the second valve, and evacuating the second buffer chamber below $8 \times 10^{-3}$Pa; and
   opening the third valve, delivering the magnet into the cleaning chamber, closing the third valve, and performing ion cleaning on the magnet with a pressure of the cleaning chamber being 0.50.7 MPa; and
   after the magnet is coated in the coating chamber:
      feeding the magnet into the first buffer chamber, opening the first valve, moving the magnet to the cooling chamber, closing the first valve, and introducing inert gas into the cooling chamber to a pressure of 100~110 kPa to cool the magnet.

7. The method according to claim 6, further comprising:
preheating the magnet at a preheating temperature of 100~200° C. before feeding the magnet into the coating chamber; and
after the magnet is cooled in the cooling chamber:
- opening a fourth valve that connects the cooling chamber to a sample discharging chamber, delivering the magnet into the sample discharging chamber, closing the fourth valve, and filling the sample discharging chamber with inert gas for further cooling; and
- opening a sample discharging chamber valve of the sample discharging chamber and delivering the magnet out of the sample discharging chamber;

wherein:
the coating machine further includes:
- a first molecular pump connected to the first buffer chamber and located at one end of a top of the first buffer chamber that is close to the coating chamber;
- two second molecular pumps connected to the cleaning chamber and installed at two ends, respectively, of a top of the cleaning chamber; and
- a third molecular pump connected to the second buffer chamber and located at one end of a top of the second buffer chamber that is close to the third valve; and
the first molecular pump, the two second molecular pumps, and the third molecular pump are configured to be in working condition when the magnet is being delivered to the cleaning chamber, cleaned in the cleaning chamber, fed into the coating chamber, and coated in the coating chamber.

8. The method according to claim 5, further comprising:
before feeding the magnet into the coating chamber:
- pre-evacuating a sample feeding chamber of the coating machine and a cooling chamber of the coating machine below $10^{-1}$Pa, pre-evacuating a cleaning chamber of the coating machine, the coating chamber, and a buffer chamber of the coating machine to below $8\times10^{-3}$Pa, introducing clean inert gas into the cleaning chamber, the coating chamber, and the buffer chamber to a pressure of 0.5~0.7MPa, wherein:
  - the cleaning chamber and the buffer chamber communicates with the coating chamber;
  - the cooling chamber is connected to the buffer chamber through a first valve; and
  - the cleaning chamber is connected to the sample feeding chamber through a second valve;
- feeding the magnet into the sample feeding chamber, and evacuating the sample feeding chamber below $8\times10^{-3}$Pa; and
- opening the second valve, feeding the magnet into the cleaning chamber, closing the second valve, and performing ion cleaning on the magnet with a pressure in the cleaning chamber being 0.5~0.7 MPa; and
after the magnet is coated in the coating chamber:
- feeding the magnet into the buffer chamber, opening the first valve, moving the magnet to the cooling chamber, closing the first valve, and introduce inert gas to the cooling chamber to a pressure of 100~110kPa to cool the magnet.

9. The method according to claim 8, further comprising:
preheating the magnet at a preheating temperature of 100~200° C. before feeding the magnet into the coating chamber; and
after the magnet is cooled in the cooling chamber:
- opening a third valve that connects the cooling chamber to a sample discharging chamber, delivering the magnet into the sample discharging chamber, closing the third valve, and filling the sample discharging chamber with inert gas for further cooling; and
- opening a sample discharging chamber valve of the sample discharging chamber and delivering the magnet out of the sample discharging chamber;

wherein:
the coating machine further includes:
- a first molecular pump connected to the sample feeding chamber and located on a side of a top of the sample feeding chamber that is close to the cleaning chamber;
- two second molecular pumps connected to the cleaning chamber and installed at two ends, respectively, of a top of the cleaning chamber; and
- a third molecular pump connected to the buffer chamber and located at one end of a top of the buffer chamber that is close to the coating chamber; and
the first molecular pump, the two second molecular pumps, and the third molecular pump are configured to be in working condition when the magnet is being fed into the cleaning chamber, cleaned in the cleaning chamber, fed into the coating chamber, and coated in the coating chamber.

* * * * *